US 6,573,526 B1

(12) United States Patent
Yamashita et al.

(10) Patent No.: US 6,573,526 B1
(45) Date of Patent: Jun. 3, 2003

(54) SINGLE ELECTRON TUNNELING TRANSISTOR HAVING MULTILAYER STRUCTURE

(75) Inventors: Tsutomu Yamashita, Miyagi (JP); Sang-Jae Kim, Sendai (JP)

(73) Assignee: Japan Science and Technology Corporation, Saitama (JP)

( * ) Notice: Subject to any disclaimer, the term of this patent is extended or adjusted under 35 U.S.C. 154(b) by 0 days.

(21) Appl. No.: 10/019,430

(22) PCT Filed: Jul. 11, 2000

(86) PCT No.: PCT/JP00/04621
§ 371 (c)(1),
(2), (4) Date: Apr. 19, 2002

(87) PCT Pub. No.: WO01/04959
PCT Pub. Date: Jan. 18, 2001

(30) Foreign Application Priority Data

Jul. 13, 1999 (JP) ............................................. 11-199221

(51) Int. Cl.$^7$ ........................... H01L 29/06; H01L 29/12
(52) U.S. Cl. ............................ 257/10; 257/9; 257/14; 257/15; 257/18
(58) Field of Search ........................... 257/14, 10, 15, 257/18, 9

(56) References Cited

U.S. PATENT DOCUMENTS 6,117,711 A * 9/2000 Wu ............................ 438/154

FOREIGN PATENT DOCUMENTS

JP  9-139491    5/1997
JP  2000-49395  * 2/2000

OTHER PUBLICATIONS

FSST News, No. 71, Dec. 15, 1998.*
Bi–2212 Intriusic Josephson Setsugou no Tunnel Tokusei, Dec. 30, 1995.

* cited by examiner

Primary Examiner—David Nelms
Assistant Examiner—Andy Huynh
(74) Attorney, Agent, or Firm—Jones, Tullar & Cooper, P.C.

(57) ABSTRACT

A single electron tunneling transistor which has a multi-layer structure exhibiting a single electron tunneling effect even with processing accuracy of not greater than 0.1 μm. The multi-layer structure of the single electron tunneling transistor is characterized by alternately growing an electrically conductive layer and a tunneling barrier layer. The number of layers is 50 or more. The structure has a minute tunneling junction having an area on the order of 1 μm square.

1 Claim, 5 Drawing Sheets (a)

(b)

SINGLE ELECTRON TUNNELING TRANSISTOR HAVING MULTILAYER STRUCTURE

TECHNICAL FIELD

The present invention relates to a single electron tunneling transistor having a multi-layer structure.

BACKGROUND ART

FIG. 1 shows a crystal structure of a copper oxide superconductor $Bi_2Sr_2CaCu_2O_y$.

As shown in FIG. 1, the crystal structure of $Bi_2Sr_2CaCu_2O_y$ is formed of a plurality of electrically conductive layers ($CuO_2$) 1 and a plurality of tunneling barrier layers (BiO) 2, which are alternately stacked one on another. The thickness t of the electrically conductive layer 1 is 3 Å, and the thickness of the tunneling barrier layer 2; namely, the lattice interval d, is 12 Å. FIG. 2 shows an electrode model of this structure.

In the model, the capacitance C between electrodes A and B is expressed by the following equation:

$$C = \epsilon_0 s/dN \quad (1)$$

where $\epsilon$ is dielectric constant.

The tunneling resistance R between electrodes A and B is expressed by the following equation:

$$R = N\rho_0(d/s) \quad (2)$$

where $\rho_0$ is specific resistance.

An element having a structure as described above exhibits a single electron tunneling effect if and when the energy gain $4e^2/C$ of an electric charge $2e$ of superconducting electrons moving from the electrode A to the electrode B is sufficiently greater than the thermal noise energy $k_BT$ (k: Boltzmann's constant).

This relation is expressed by the following.

$$2e^2/C > k_BT \quad (3)$$

In accordance with the above expressions (1) and (3), in order to obtain a single electron tunneling effect, the number N of the layers must satisfy the following relation.

$$N > (\epsilon s/d)(kT/2e^2) \quad (4)$$

In fact, when a square element of 1 μm×1 μm is made from a $Bi_2Sr_2CaCu_2O_y$ single crystal and placed in liquid helium having a temperature of 4 K, single electron tunneling effect can be observed for any number N greater than 50 (N>50), and this number corresponds to a thickness which can be attained without difficulty. Another condition for obtaining a single electron tunneling effect is that the tunneling resistance R of the element must be greater than the quantum resistance $R_0$ represented by the following equation.

$$R_0 = h/4e^2 = 6k\Omega \quad (5)$$

Therefore, $$R > h/4e^2. \quad (6)$$

From the above expressions (2) and (6), $$N > (s/\rho_0 d)\cdot(h/4e^2). \quad (7)$$

Again, N>50 holds. Manufacturing a 1 μm×1 μm square element of N=50 (i.e., 50 layers) is very easy as compared to the conventional case in which N=1 and the area s of the element is smaller than a square of 1 μm×1 μm.

FIG. 3 shows a conventional single electron tunneling element having a single tunneling barrier layer.

From relation (4), the condition under which this single electron tunneling element exhibits the single electron tunneling effect is:

$$N = 1 > (\epsilon s/d)\cdot(kT/2e^2) \quad (8)$$

From relation (7), the following relation holds:

$$N = 1 > (s/\rho_0 d)(h/4e^2) \quad (9)$$

Thus, in the conventional case shown in FIG. 3, s must be made smaller, by a factor of at least 2, to thereby attain $(0.1)^2$ μm².

DISCLOSURE OF THE INVENTION

However, in a single electron tunneling element including the aforementioned tunneling barrier layer, difficulty is still encountered in realizing a single electron tunneling element processing method having a processing accuracy of not greater than 0.1 μm.

In view of the foregoing, an object of the present invention is to provide a single electron tunneling transistor having a multi-layer structure exhibiting the single electron tunneling effect even at a processing accuracy of not less than 0.1 μm.

In order to attain the above-mentioned object, the present invention provides the following.

[1] A single electron tunneling transistor having a multi-layer structure, Comprising a plurality of electrically conductive layers and a plurality of tunneling barrier layers, the conductive layers and the tunneling barrier layers being alternately stacked one on another, and a control gate, the total number of the conductive layers and the tunneling barrier layers being at least 50, and a minute tunneling junction in the structure having an area on the order of 1 μm square, wherein the control gate is formed at a central portion of the single electron tunneling transistor, a first and a second pair of grooves (a-2, a-1) and (a-3, a-4) being provided for centering the control gate, the grooves of each pair opening toward opposite directions, so as to permit an electric field to be applied to tunneling element electrodes existing at the bottom portions of the grooves (a-2) and (a-3).

[2] A single electron tunneling transistor having a multi-layer structure, comprising a plurality of electrically conductive layers and a plurality of tunneling barrier layers, the conductive layers and the tunneling barrier layers being alternately stacked one on another, and a control gate, the total number of the conductive layers and the tunneling barrier layers being at least 50, and a minute tunneling junction in the structure having an area on the order of 1 μm square.

[3] A single electron tunneling transistor having a multi-layer structure as described in [2], wherein the control gate is formed at a central portion of the single electron tunneling transistor, a first and a second pairs of grooves (a-2, a-1) and (a-3, a-4) being provided centering the control gate, the grooves of each pair opening toward opposite directions, so as to permit an electric field to be applied to tunneling element electrodes existing at bottom portions of the grooves (a-2) and (a-3) provided centering the control gate G.

BEST MODE FOR CARRYING OUT THE INVENTION

Embodiments of the present invention will next be described in detail.

By using a multi-layer single crystal, even in the case where an area s or a temperature T is large, when the number of layers N is increased, the above mentioned expressions (4) and (7), which represent the conditions for a single electron tunneling effect to occur, are satisfied.

Therefore, with a minute electrode having a size of about 1 $\mu$m, which is realized with ease by the present processing technique, the single electron tunneling conditions can be satisfactorily satisfied by means of increasing the number of layers N and attaining the relation N>50.

Further, by increasing the number of layers N to attain the relation N>200, there can be obtained a single electron tunneling phenomenon at a temperature T of about 10 K, which has heretofore been impossible.

Figure 1:
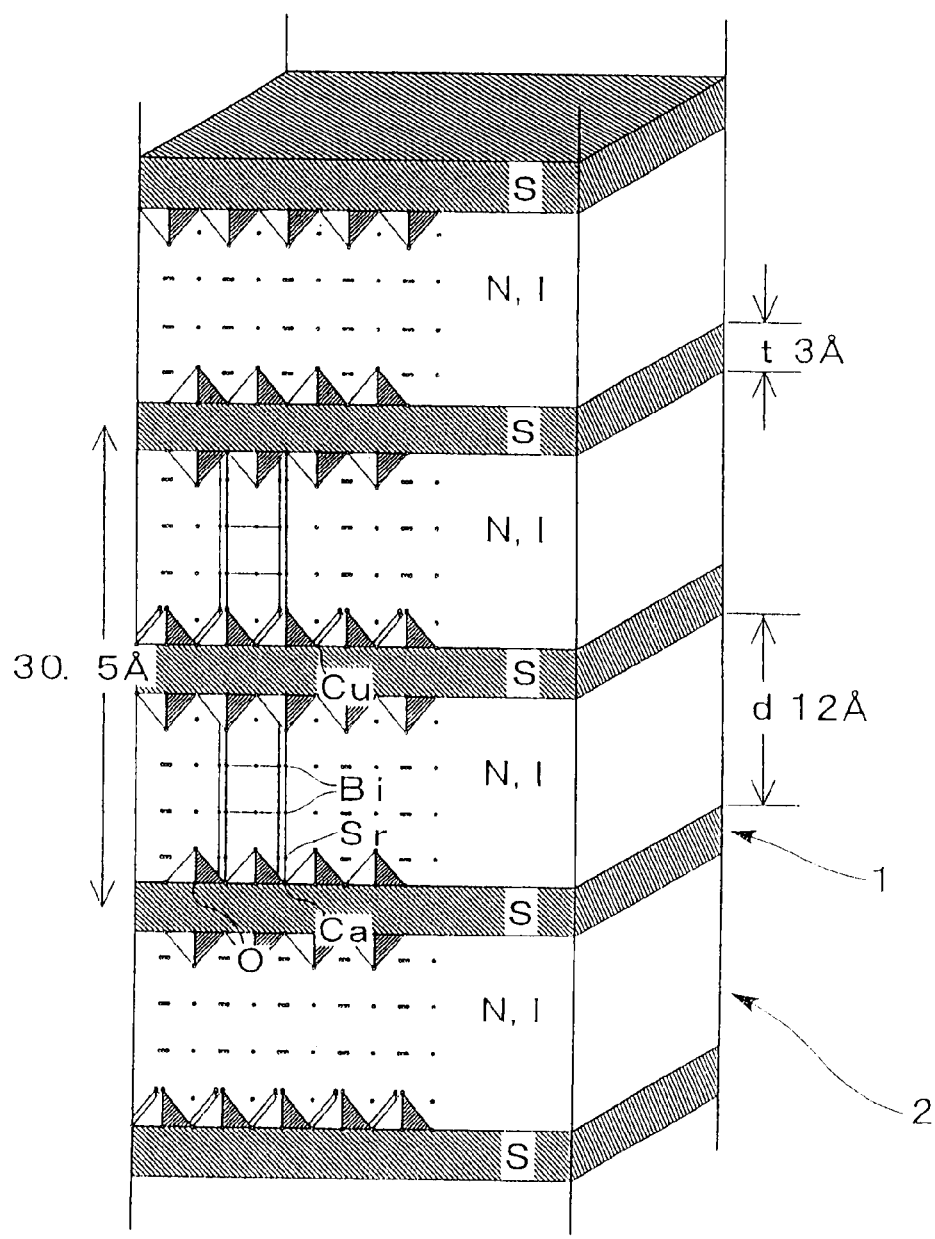
FIG. 1 shows the crystal structure of a copper oxide superconductor $Bi_2Sr_2CaCu_2O_y$.
Figure 2:
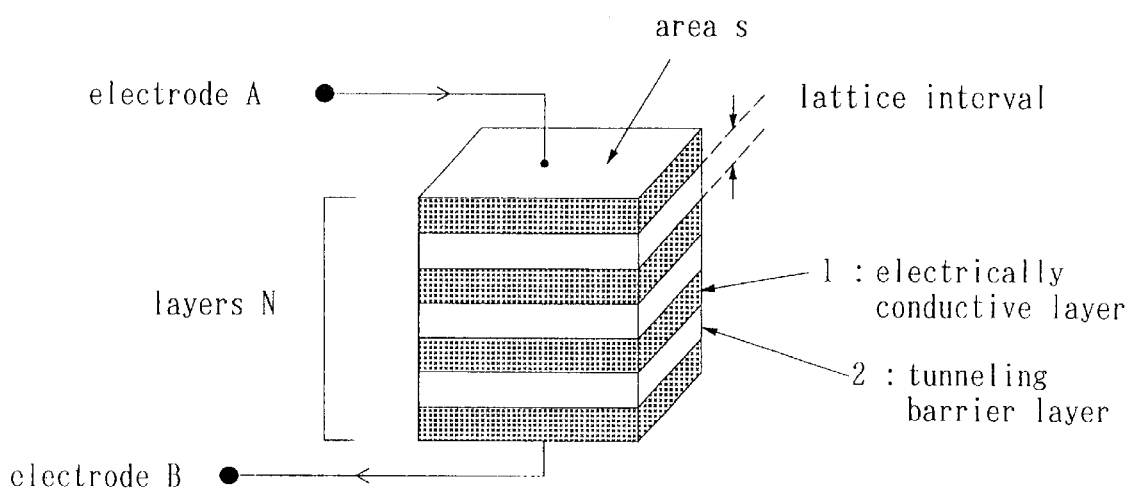
FIG. 2 shows an electrode model corresponding to the crystal structure shown in FIG. 1.
Figure 3:
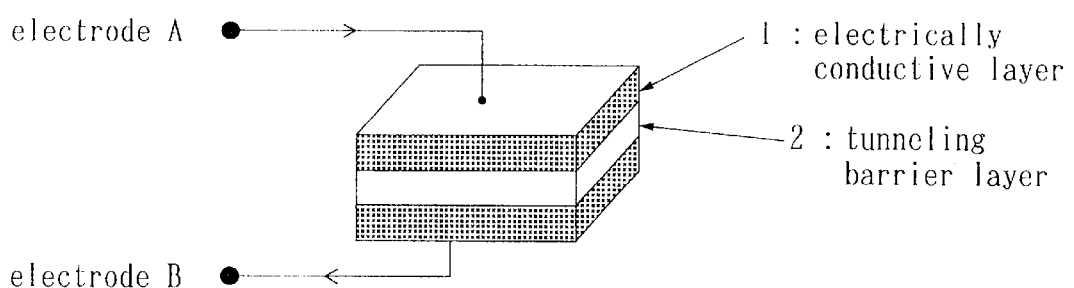
FIG. 3 shows a conventional single electron tunneling element having a single tunneling barrier layer.
Figure 4:
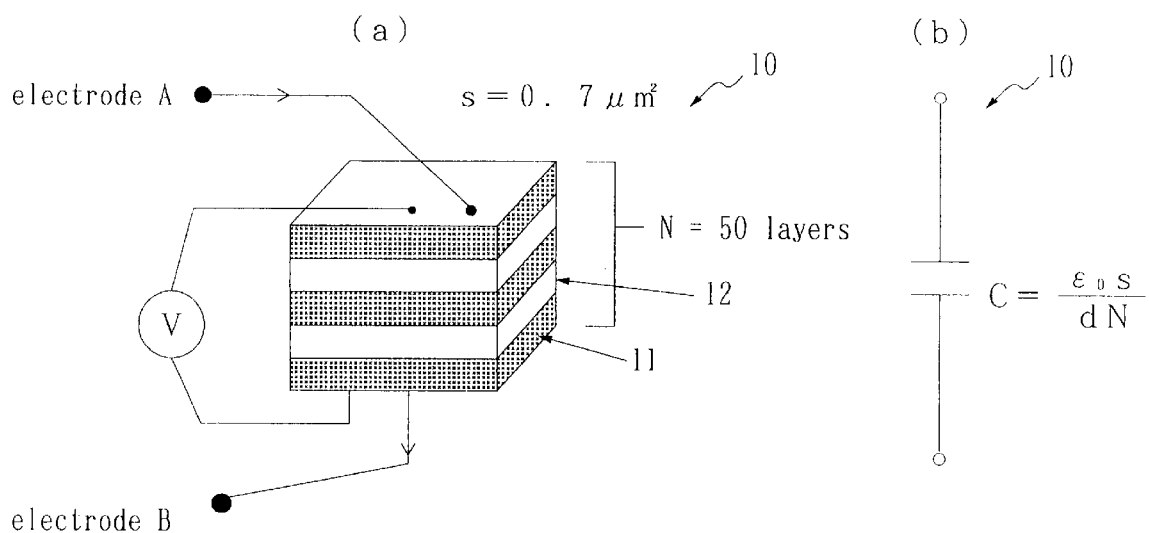
FIG. 4 shows a structure and an equivalent circuit diagram of a single electron tunneling transistor of a first embodiment of the present invention.

FIG. 4 shows a structure and an equivalent circuit diagram of a single electron tunneling transistor of the first embodiment of the present invention.

In FIG. 4, reference numeral 10 denotes a single electron tunneling transistor, reference numeral 11 denotes an electrically conductive layer ($CuO_2$), and reference numeral 12 denotes a tunneling barrier layer (BiO).

FIG. 4(a) shows the single electron tunneling transistor 10 in which s=0.7 $\mu m^2$ and N=50 layers. These values of s=0.7 $\mu m^2$ and N=50 layers clearly satisfy the aforementioned expressions (4) and (7). Also, FIG. 4(b) shows an equivalent circuit in which capacitance C is represented by $C=\epsilon_0 s/dN$.

Figure 5:
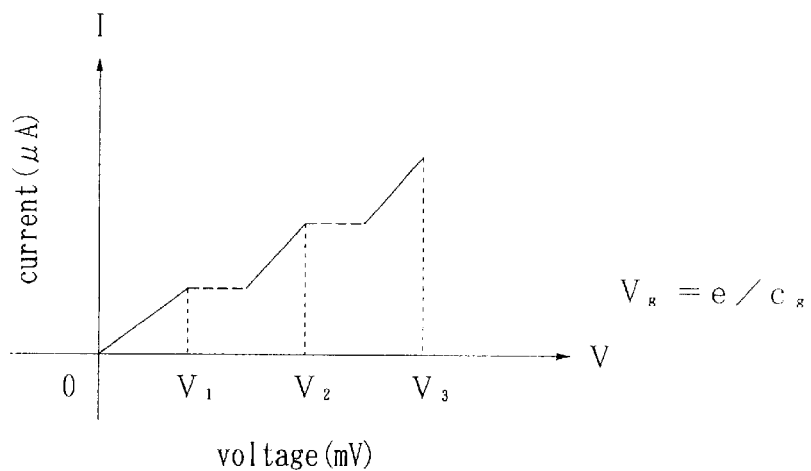
FIG. 5 shows I–V characteristics of the single electron tunneling transistor of the first embodiment of the present invention.

FIG. 5 shows I–V characteristics of the single electron tunneling transistor of the first embodiment of the present invention, in which the axis of abscissa represents voltage (mV) and the axis of ordinate represents current ($\mu$A).

As shown in FIG. 5, at $V_1$, $V_2$, and $V_3$, electric current shows maximum values. Electric voltage at which single electron tunneling effect is exhibited satisfies $e=CV_1$, $2e=CV_2$, or $3e=CV_3$. Here, C is capacitance of the single electron tunneling element. I–V characteristics vary periodically at intervals of e/C. In addition, a relation $V_g=e/C_g$ is satisfied.

Figure 6:
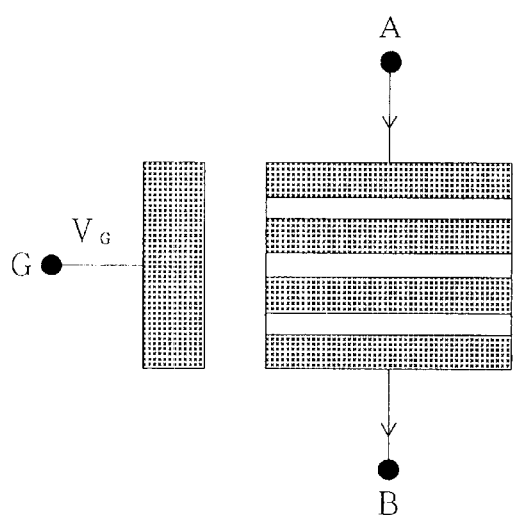
FIG. 6 shows a structure and an equivalent circuit diagram of a single electron tunneling transistor of a second embodiment of the present invention.
Figure 6:
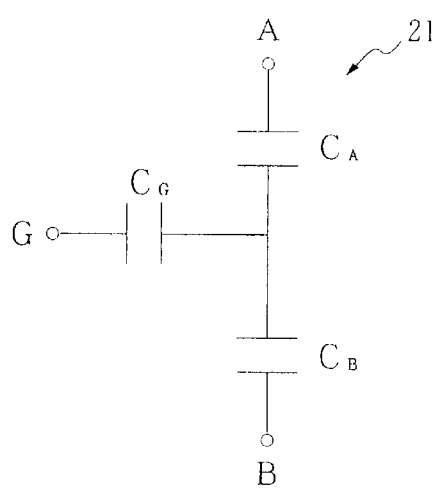

FIG. 6 shows a structure and the equivalent circuit diagram of a single electron tunneling transistor of the second embodiment of the present invention, in which $V_G$ represents gate voltage.

FIG. 6(a) shows a single electron tunneling transistor 21 having a control gate G. In the equivalent circuit represented by FIG. 6(b), the gate G is connected, through a gate capacitance $C_G$, to a series single electron tunneling element which has capacitances $C_A$ and $C_B$.

Figure 7:
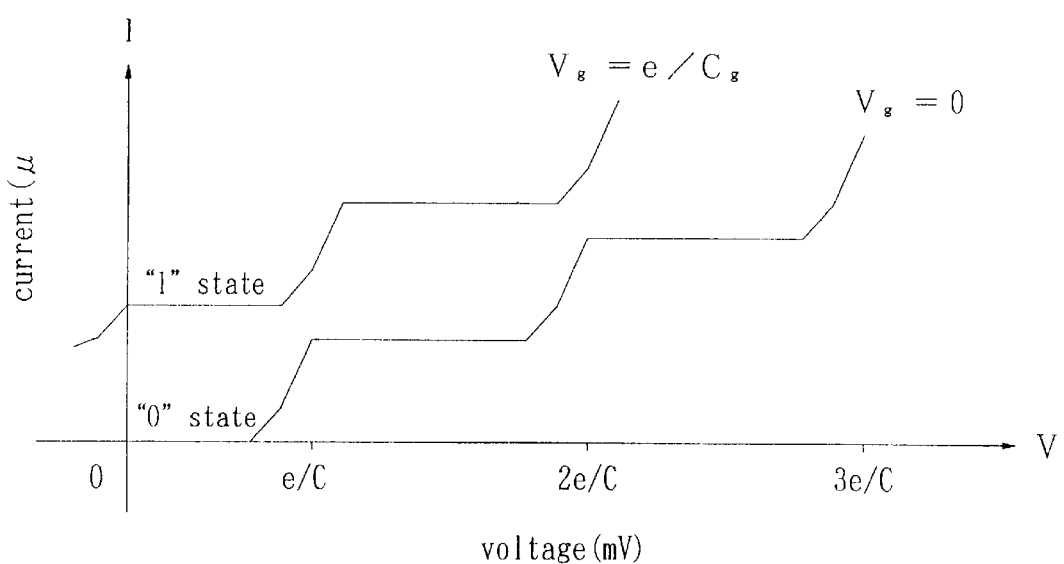
FIG. 7 shows I–V characteristics of the single electron tunneling transistor of the second embodiment of the present invention.

FIG. 7 shows I–V characteristics of the single electron tunneling transistor of the second embodiment of the present invention, in which the axis of abscissa represents voltage (mV) and the axis of ordinate represents current ($\mu$A).

As shown in FIG. 7, when $V_g=0$, current does not flow through the tunneling element at V=0, and thus the tunneling element is in a "0" state. However, when voltage $V_g=e/C_g$ is applied to the gate, current flows through the tunneling element, turning the tunneling element to a "1" state. Thus, the tunneling element acts as a switching device.

However, provision of the control gate G as shown in FIG. 6 is not necessarily easy.

Figure 8:
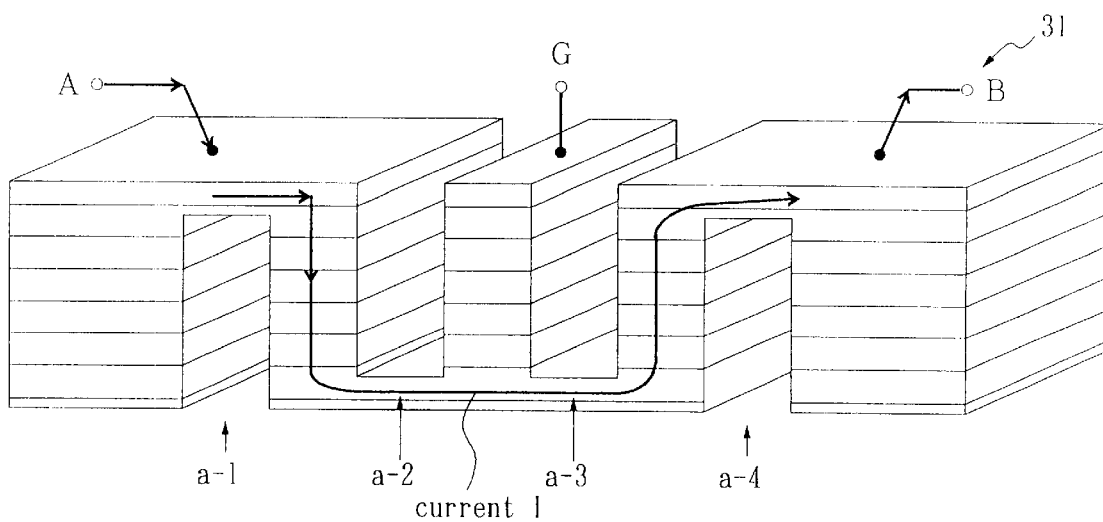
FIG. 8 is a perspective view showing a structure of the single electron tunneling transistor of the second embodiment of the present invention.

Therefore, according to the present invention, a multi-layer tunneling material formed of a multi-layer single crystal or an artificial multi-layer structure is processed to provide grooves (a-1 through a-4) as shown in FIG. 8, and current is allowed to flow from terminal A to terminal B. In this case, the current flows through the tunneling element between grooves a-1 and a-2, and then through the tunneling element between grooves a-3 and a-4 to terminal B.

Figure 9:
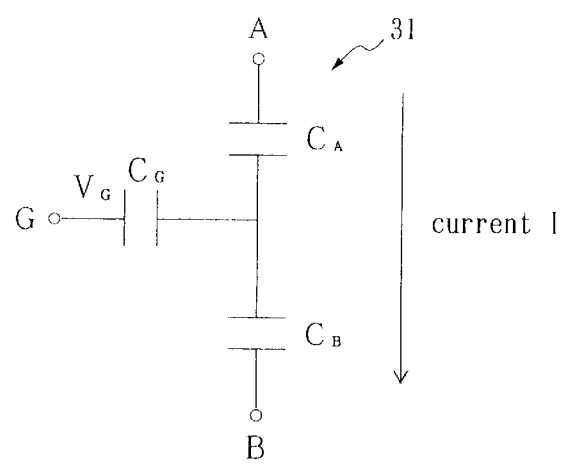
FIG. 9 is an equivalent circuit diagram of the single electron tunneling transistor shown in FIG. 8.

When a voltage $V_G$ is applied to the terminal G, an electric field is applied to bottom portions of the grooves a-2 and a-3 which serve as tunneling element electrodes, and the equivalent circuit of a single electron tunneling transistor shown in FIG. 8, represented in FIG. 9, is similar to that shown FIG. 6(b). By application of a gate voltage $V_G$, tunneling current I which flows from terminal A to terminal B varies as shown in FIG. 7, to thereby realize a single electron tunneling transistor 31.

The present invention is not limited to the above-described embodiments. Numerous modifications and variations of the present invention are possible in light of the spirit of the present invention, and they are not excluded from the scope of the present invention.

INDUSTRIAL APPLICABILITY

The present invention is suitably applicable to a superconductive single-crystal single-electron transistor and a memory for LSIs. Moreover, the present invention is applicable not only to high temperature superconductive materials, but also to a high-temperature-operating single electron tunneling transistor formed from a material of thin film or a single crystal of multi-layer structure.

What is claimed is:

1. A single electron tunneling transistor having a multi-layer structure, comprising a plurality of electrically conductive layers and a plurality of tunneling barrier layers, the conductive layers and the tunneling barrier layers being alternately stacked one on another, and a control gate, the total number of the conductive layers and the tunneling barrier layers being at least 50, and a minute tunneling junction in the structure having an area on the order of 1 $\mu$m square, wherein the control gate is formed at a central portion of the single electron tunneling transistor, a first and a second pair of grooves provided for centering the control gate, the grooves of each pair opening in opposite directions so as to permit an electric field to be applied to the bottom portion of the grooves.

\* \* \* \* \*